United States Patent
Lim

(10) Patent No.: US 11,972,166 B2
(45) Date of Patent: Apr. 30, 2024

(54) VISUAL DIGITAL DECORATION APPARATUS AND CONTROL METHOD THEREFOR

(71) Applicant: Seongkyu Lim, Daegu (KR)

(72) Inventor: Seongkyu Lim, Daegu (KR)

( * ) Notice: Subject to any disclaimer, the term of this patent is extended or adjusted under 35 U.S.C. 154(b) by 341 days.

(21) Appl. No.: 17/434,067

(22) PCT Filed: Apr. 3, 2019

(86) PCT No.: PCT/KR2019/003954
§ 371 (c)(1),
(2) Date: Aug. 26, 2021

(87) PCT Pub. No.: WO2020/175733
PCT Pub. Date: Sep. 3, 2020

(65) Prior Publication Data
US 2022/0130324 A1    Apr. 28, 2022

(30) Foreign Application Priority Data
Feb. 26, 2019  (KR) .................. 10-2019-0022736

(51) Int. Cl.
*G06F 3/14* (2006.01)
*G06F 3/0484* (2022.01)
*G06T 11/00* (2006.01)
*G06T 19/00* (2011.01)
*G06V 20/40* (2022.01)
(Continued)

(52) U.S. Cl.
CPC .......... *G06F 3/1446* (2013.01); *G06F 3/0484* (2013.01); *G06T 11/00* (2013.01); *G06T 19/006* (2013.01); *G06V 20/40* (2022.01); *G09G 3/035* (2020.08); *G09G 3/32* (2013.01); *H01L 23/5387* (2013.01); *H01L 25/0753* (2013.01); *H01L 33/62* (2013.01); *G09G 2354/00* (2013.01);
(Continued)

(58) Field of Classification Search
None
See application file for complete search history.

(56) References Cited

U.S. PATENT DOCUMENTS

2012/0013646 A1    1/2012  Ichioka et al.
2016/0343771 A1*  11/2016  Bower ................. H01L 21/77
(Continued)

FOREIGN PATENT DOCUMENTS

CN     107801071 A  *  3/2018
JP     2005-323114 A    11/2005
(Continued)

OTHER PUBLICATIONS

International Search Report issued for corresponding International Patent Application No. PCT/KR2019/003954 dated Nov. 25, 2019, along with an English translation.
(Continued)

*Primary Examiner* — Jwalant Amin
(74) *Attorney, Agent, or Firm* — Hauptman Ham, LLP

(57) ABSTRACT

The present invention relates to a visual digital decoration device, in which a microLED display skin is coated on to an interior surface unit for decoration purpose, and a decorative design is selected by a user, an artificial intelligence recommendation, or an augmented reality recommendation using a portable terminal, so that the decorative design may appear on the microLED display skin.

5 Claims, 10 Drawing Sheets

(51) Int. Cl.
*G09G 3/00* (2006.01)
*G09G 3/32* (2016.01)
*H01L 23/538* (2006.01)
*H01L 25/075* (2006.01)
*H01L 33/62* (2010.01)

(52) U.S. Cl.
CPC ... *G09G 2360/144* (2013.01); *G09G 2370/16* (2013.01)

(56) References Cited

U.S. PATENT DOCUMENTS

| | | | | |
|---|---|---|---|---|
| 2018/0115734 A1* | 4/2018 | Whang | .................... | G06T 7/337 |
| 2018/0301121 A1* | 10/2018 | Kim | ................. | H04N 21/41265 |
| 2024/0005388 A1* | 1/2024 | Gore | ...................... | G06Q 10/10 |

FOREIGN PATENT DOCUMENTS

| | | | |
|---|---|---|---|
| KR | 10-2009-0121504 A | 11/2009 | |
| KR | 10-2012-0046668 A | 5/2012 | |
| KR | 10-2012-0113094 A | 10/2012 | |
| KR | 10-2017-0098487 A | 8/2017 | |
| WO | WO-2010130658 A1 * | 11/2010 | ............. A47B 97/00 |

OTHER PUBLICATIONS

Written Opinion issued for corresponding International Patent Application No. PCT/KR2019/003954 dated Nov. 25, 2019.

* cited by examiner

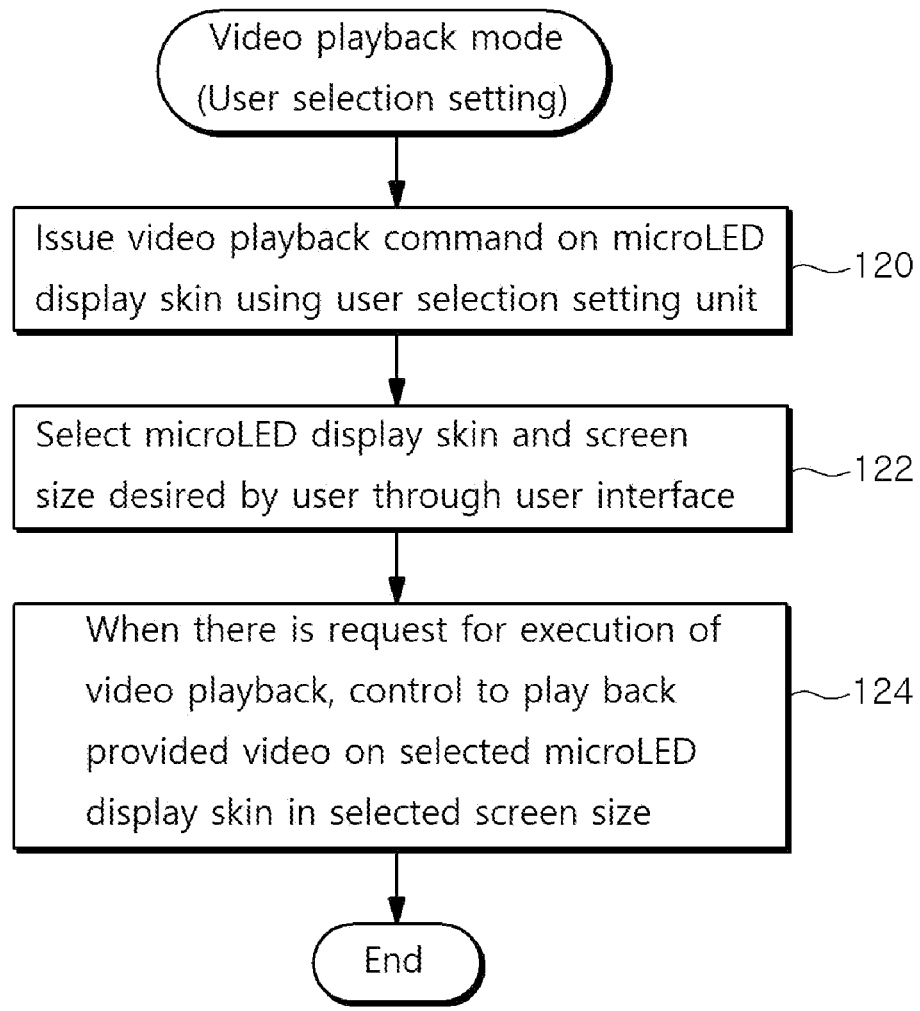

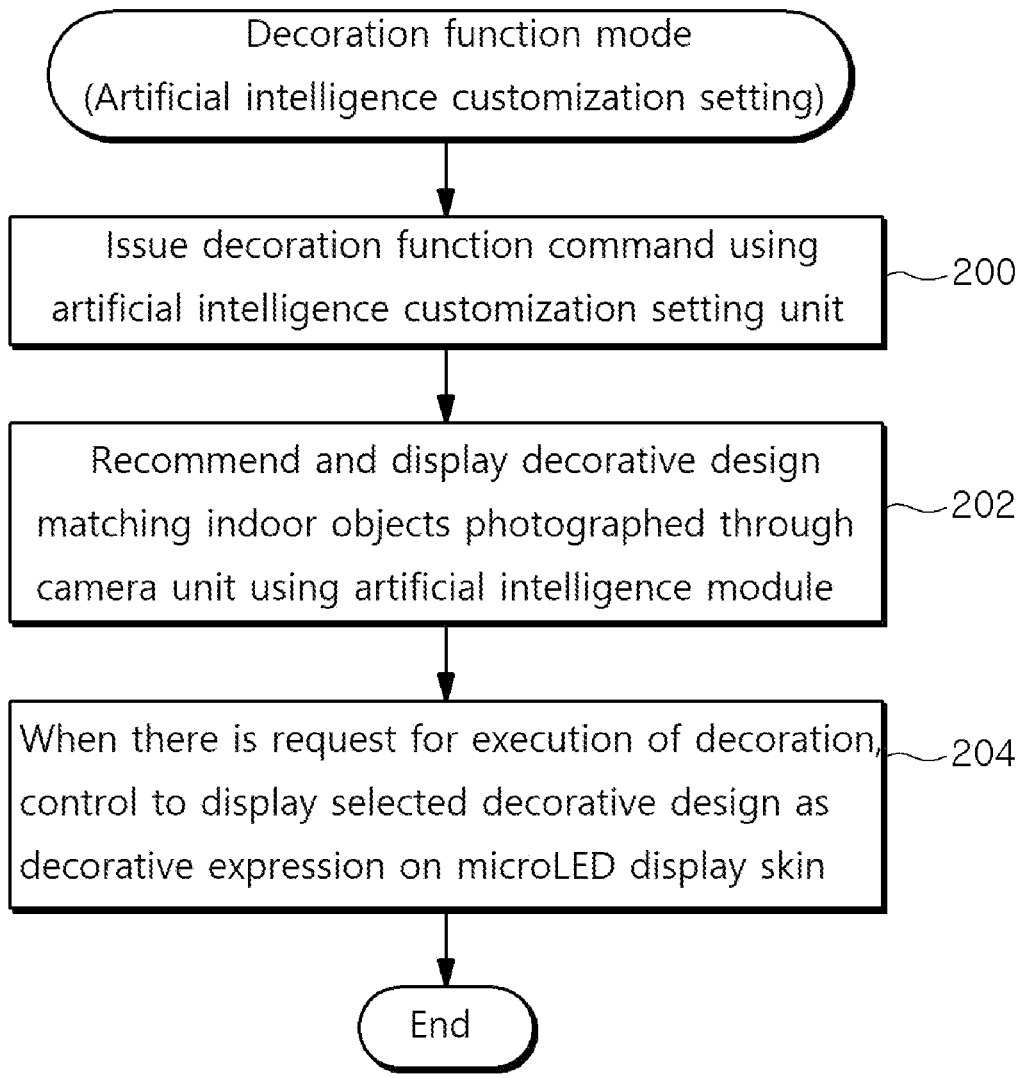

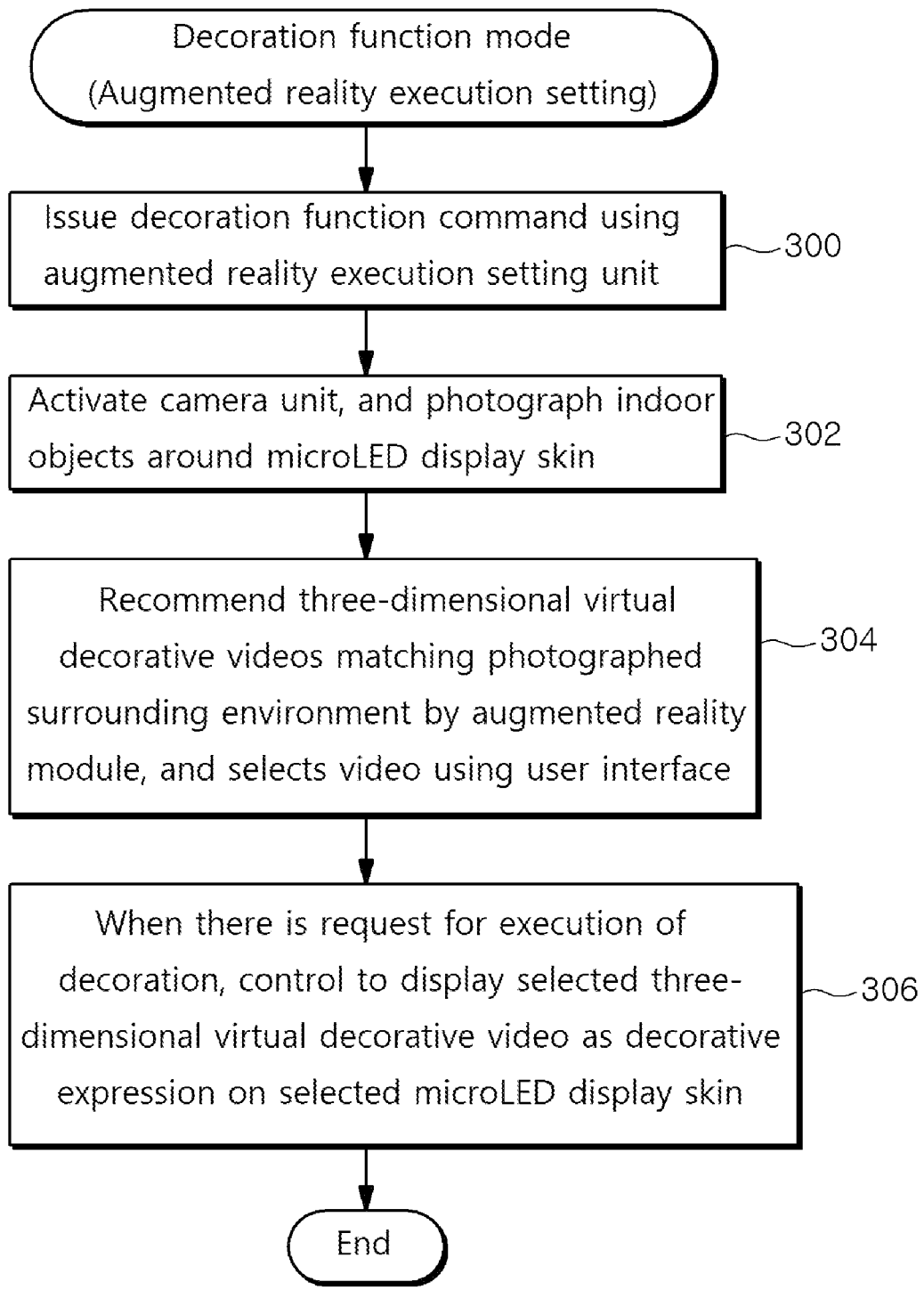

VISUAL DIGITAL DECORATION APPARATUS AND CONTROL METHOD THEREFOR

CROSS-REFERENCE TO RELATED APPLICATION

The present application is a national stage filing under 35 U.S.C § 371 of PCT application number PCT/KR2019/003954 filed on Apr. 3, 2019 which is based upon and claims the benefit of priorities to Korean Patent Application No. 10-2019-0022736, filed on Feb. 26, 2019, in the Korean Intellectual Property Office, which are incorporated herein in their entireties by reference.

TECHNICAL FIELD

The present invention relates to a decoration apparatus, and more particularly, to a visual digital decoration apparatus that can be expressed according to personality and preference of a user, and express a decorative design or video that the user desires to select, and a control method thereof.

BACKGROUND ART

Generally, indoor walls or ceilings of a building is finished with wallpaper or painting for decoration purpose and protection.

As wallpaper has different material performance and functionality depending on the material, it should be selected considering the performance and functionality. That is, material performance such as durability, weather resistance, abrasion resistance, and impact resistance, and functionality such as decorativeness and stain resistance should be considered.

In a room of a building, interior furniture or large home appliances such as a refrigerator and the like designed in various patterns and colors are also installed.

However, once the wallpaper, furniture, and large home appliances such as a refrigerator are applied, the selected color and design should be maintained.

For example, in the case of wallpaper, once it is applied on a wall, it is practically difficult to change the color or pattern unless it is applied again later. Therefore, a uniform presentation according to the first selected pattern and color should be maintained inevitably.

Therefore, although a user desires to have a difference in the design or color of wallpaper of a room or furniture or large home appliances arranged in a room, there is a limit in that it cannot be arbitrarily produced.

DISCLOSURE OF INVENTION

Technical Problem

Therefore, an object of the present invention is to provide a visual digital decoration apparatus and a control method thereof, which can express the personality and preference of a user through a decorative screen coated on the surface of a wall, wallpaper, furniture, or large home appliances in a room, and express a decorative design or video and illumination light that the user desires.

Technical Solution

To accomplish the above object, according to one aspect of the present invention, there is provided a visual digital decoration apparatus comprising: one or more microLED display skins 20 coated on an interior surface unit 10 of one or more among surfaces of walls or a ceiling of a room and surfaces of furniture and large home appliances arranged in a room to be disposed in a form of a decorative screen; one or more remote slaves 50 provided to drive a corresponding microLED display skin 20; and a portable terminal 6 for wirelessly controlling the remote slave 50 so that a decorative design or video requested through a user interface may be expressed on a microLED display skin 20 selected by a user, wherein the microLED display skin 20 has a configuration in which a semiconductor device layer 24 capable of displaying and expressing a color and a design toward the outside and having microLED pixels 26 on a flexible substrate is transferred and attached, and the remote slave 50 includes a power supply unit 52 connected to a power supply line, a remote control unit 54 for performing control to display the decorative design or video wirelessly transmitted from the portable terminal 6 on the microLED display skin 20, a USB port 57 capable of USB (Universal Serial Bus) connection, and a short-range wireless communication unit 59 for remotely transmitting and receiving data via short-range wireless communication with the portable terminal 6, and the portable terminal 6 includes a decorative design and video mobile app 80 mounted on the portable terminal 6 to control to select a decorative design or video requested through a user interface 86 and wirelessly transmit the decorative design or video from the portable terminal 6 to a remote slave connected to a microLED display skin 20 selected by the user.

Furthermore, in the visual digital decoration apparatus of the present invention, the microLED display skin 20 is configured of a transparent microLED display skin having transparency and flexibility, and the remote slave 50 further includes: a photodetector 56 for detecting brightness of light around a corresponding microLED display skin 20, and a battery 58 provided in case of power failure in the remote slave 50 or the microLED display skin 20.

In addition, in the present invention, the decorative design and video mobile app 80 includes one or more among: a user selection setting unit 82 that allows a user to select a decorative design or video corresponding to the microLED display skin 20 selected by the user and set a display, or turns on or off light using the microLED display skin 20 when there is a request for turning on or off a lighting function; an artificial intelligence customization setting unit 84 that allows an artificial intelligence unit to analyze a video captured through a camera unit 88 of the portable terminal 6 when there is a request for a customized decorative design based on an artificial intelligence function, select a decorative design, and set a display; and an augmented reality execution setting unit 90 that allows a virtual object video matching with a neighboring real object to be expressed together on a corresponding microLED display skin 20 desired by the user using the camera unit 88 of the portable terminal 6 and an augmented reality program.

In addition, according to another aspect of the present invention, there is provided a control method of a visual digital decoration apparatus including a remote slave 50 for driving one or more microLED display skins 20 disposed to be coated on one or more interior surface units 10, and a portable terminal 6 for wirelessly controlling the remote slave 50 so that a decorative design or video requested through a user interface may be expressed on a microLED display skin 20 selected by a user, the method comprising the steps of: mounting a decorative design and video mobile app 80 that controls to display the decorative design or video on the microLED display skin 20 on the portable terminal 6; selecting a decorative design desired by the user and a microLED display 20 at a location desired by the user through a user selection setting unit 82 in the decorative design and video mobile app 80 in the portable terminal 6 and a user interface 86 in the portable terminal 6, and displaying the decorative design selected by the user interface 86 as a decorative expression on the selected microLED display skin 20, by the remote slave 50, as a decoration execution request is wirelessly transmitted; selecting a lighting function desired by the user and a microLED display 20 at a location desired by the user through the user selection setting unit 82 in the decorative design and video mobile app 80 in the portable terminal 6 and the user interface in the portable terminal 6, and turning on and off illumination light selected by the user interface 86 on the selected microLED display skin 20, by the remote slave 50, as a lighting function execution request is wirelessly transmitted; and selecting a video playback function desired by the user and a microLED display 20 at a location desired by the user through the user selection setting unit 82 in the decorative design and video mobile app 80 in the portable terminal 6 and the user interface 86 in the portable terminal 6, and displaying a video selected by the user interface 86 to be played back in a screen size desired by the user on the selected microLED display skin 20, by the remote slave 50, as a video playback function execution request is wirelessly transmitted.

In addition, the control method of the visual digital decoration apparatus of the present invention further comprises the steps of: recommending, by an artificial intelligence module, decorative designs matching indoor objects through an artificial intelligence customization setting unit 84 in the decorative design and video mobile app 80 in the portable terminal 6 and a camera unit 88 in the portable terminal 6, selecting a decorative design through the user interface 86, and displaying the selected decorative design as a decorative expression on the microLED display skin 20, by the remote slave 50, as a decoration execution request is wirelessly transmitted; and recommending, by an augmented reality module, virtual decorative videos photographed by the camera unit 88 and matching with indoor objects through an augmented reality execution setting unit 90 in the decorative design and video mobile app 80 in the portable terminal 6 and the camera unit 88 in the portable terminal 6, selecting a virtual decorative video through the user interface 86, and displaying the selected virtual decorative video as a decorative expression on the microLED display skin 20, by the remote slave 50, as a decoration execution request is wirelessly transmitted.

Advantageous Effects

The present invention is advantageous in that as a microLED display skin is coated on an interior surface unit such as the surface of a wall or ceiling of a room, or the surface of furniture or a large home appliance arranged in a room for decoration purpose, and a decorative design is selected or applied as a user desires or by recommendation of artificial intelligence or augmented reality using a portable terminal such as a smartphone, the decorative design (including color) is displayed on the microLED display skin, and therefore, it is possible to express a decoration on a display skin to be suitable for the preferences of the user, change even the skin colors or designs using the portable terminal as needed by the user, play back a still image or a video wirelessly transmitted from the portable terminal, and provide a lighting function using a specific microLED display skin.

BRIEF DESCRIPTION OF THE DRAWINGS

FIGS. 8*a* to 8*c* are control flowcharts expressing a decorative design function, a lighting function, and a video function on a microLED display skin using a user selection setting unit of a decorative design and video mobile app mounted on a portable terminal of the present invention FIG. 9 is a control flowchart expressing a decorative design function on a microLED display skin using an artificial intelligence customization setting unit of a decorative design and video mobile app mounted on a portable terminal of the present invention.

FIG. 10 is a control flowchart expressing a decorative design function on a microLED display skin using an augmented reality execution setting unit of a decorative design and video mobile app mounted on a portable terminal of the present invention.

BEST MODE FOR CARRYING OUT THE INVENTION

Hereinafter, preferred embodiments of the present invention will be described in detail with reference to the accompanying drawings.

Figure 1:
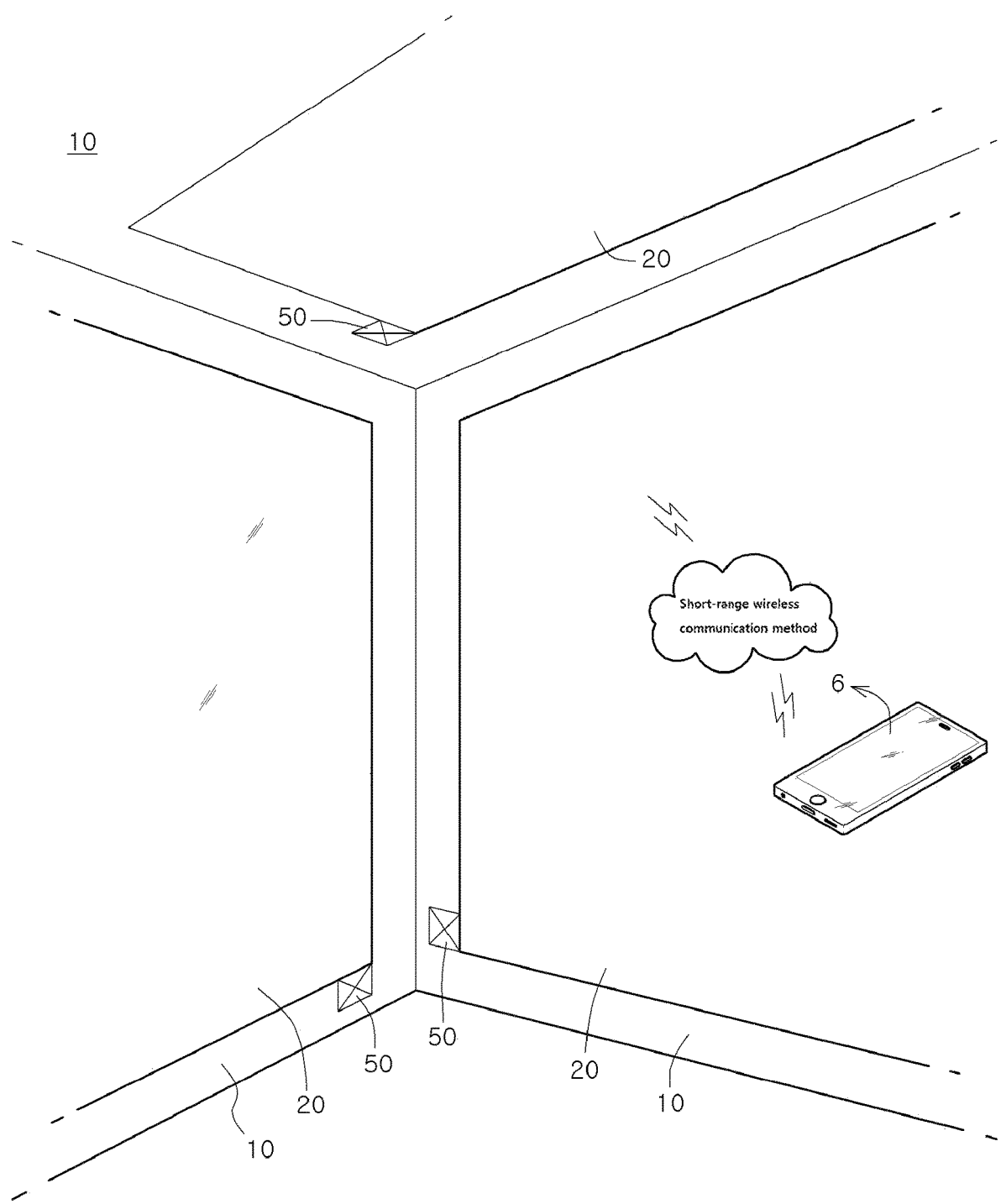
FIG. 1 is a view showing the arrangement concept of a visual digital decoration apparatus according to an embodiment of the present invention.
Figure 2:
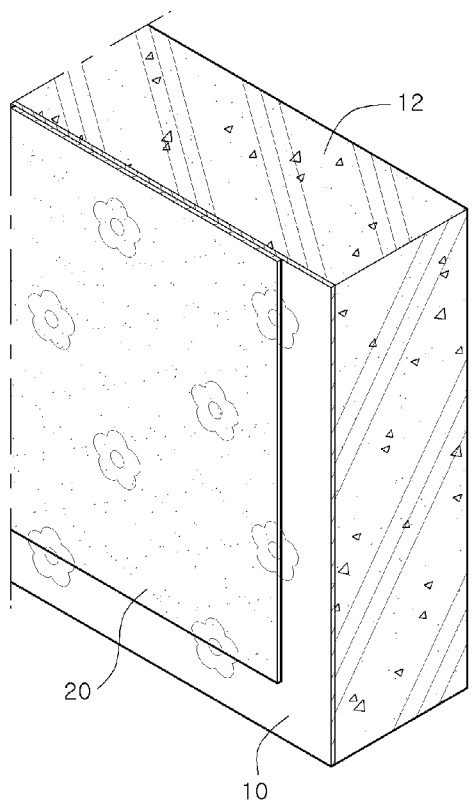
FIG. 2 is a perspective view showing the major part of a microLED display skin coated on an interior surface unit for decoration in a visual digital decoration apparatus of the present invention.
Figure 3:
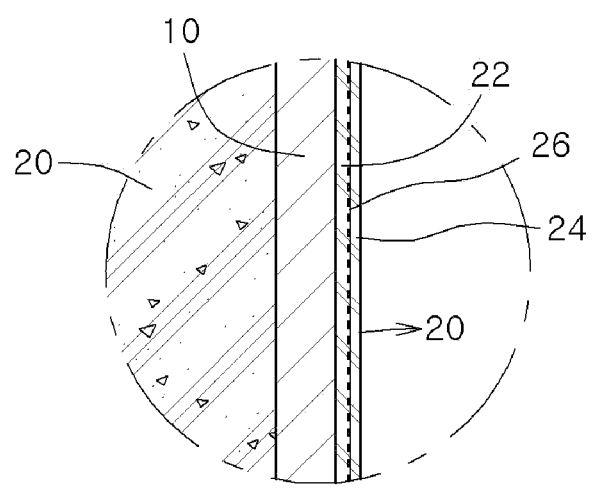
FIG. 3 is a cross-sectional view showing a microLED display skin coated on an interior surface unit in a visual digital decoration apparatus of the present invention.

FIG. 1 is a view showing the arrangement concept of a visual digital decoration apparatus according to an embodiment of the present invention, FIG. 2 is a perspective view showing the major part of a microLED display skin 20 coated on an interior surface unit 10 for decoration in a visual digital decoration apparatus of the present invention, and FIG. 3 is a cross-sectional view showing a microLED display skin 20 coated on an interior surface unit 10 in a visual digital decoration apparatus of the present invention.

A visual digital decoration apparatus according to an embodiment of the present invention is configured of one or more microLED display skins 20 coated on an interior surface unit 10 of one or more among the surfaces of walls or a ceiling of a room and surfaces of furniture and large home appliances such as a refrigerator to be disposed in the form of a decorative screen, one or more remote slaves 50 provided to drive a corresponding microLED display skin 20, and a portable terminal 6 such as a smartphone or the like for wirelessly controlling a decorative design or video set through a user interface to be expressed on the microLED display skin 20 in a short-range wireless communication method.

In the present invention, it should be understood that the interior surface unit 10 may be a surface unit provided by an indoor space of a building, such as a home, a building, or an office space, and may also be an indoor space of a moving object such as a ship or a vehicle.

A microLED display is a display in which microLED elements with a size of 5 to 100 μm (1 μm=one millionth of a meter), i.e., only 1/100 of the size of an LED element used as a light source in an existing LCD TV, are densely connected one after another on a substrate (in the example of the present invention, a transparent substrate is used). The red, green, and blue light sources emit light by themselves, and the thickness and weight are considerably reduced compared to those of conventional LCD displays, and the size of the display may be almost infinitely increased theoretically.

As power consumption is very small compared to an OLED (1/5 of the power consumption of an OLED display), the microLED display may be used for an extended period of time, and illuminance, saturation, and power efficiency are much superior compared to those of existing OLEDs. In addition, since an LED chip itself is used as a pixel, the microLED display is suitable for implementing a flexible or rollable screen.

In addition, the microLED display may implement excellent video quality, such as sharper brightness, higher contrast ratio, and perfect black expression, compared to existing LED or LCD displays, and may be installed in various sizes and shapes to be suitable for the purposes of use and characteristics of space.

That is, the microLED display like this may increase the screen size infinitely and may be configured to be thin, light, long-lived and stable much more than existing OLED or LCD displays.

The microLED display skin 20 of the present invention has the characteristics of a macroLED display like this and is installed on a wall or ceiling surface in a partial or full size as needed as shown in FIG. 1. In addition, although not shown in FIG. 1, it may be installed to be coated on the surface of furniture arranged in a room or on the surface of large home appliances such as a refrigerator.

When the microLED display skin 20 is installed on the interior surface unit 10 of a wall or ceiling surface as shown in the example of FIG. 1, since the microLED display skin 20 of the present invention has transparency, it may be installed on the interior surface unit 10 in a state of wallpaper applied on the wall 12 as shown in the partially exploded perspective view of FIG. 2, and it may be installed even when the wallpaper is not applied.

In addition, as shown in the configuration of the cross-sectional view of FIG. 3, the microLED display skin 20 of the present invention is attached on the interior surface unit 10 constituting an indoor wall surface, and the schematic configuration thereof is a configuration in which a semiconductor device layer 24 having microLED pixels 26 is transferred and attached on a transparent flexible substrate 22 having transparency and flexibility.

The microLED display skin 20 of the present invention is provided by implanting a semiconductor device 24 having numerous microLED pixels 26 provided as micro p-n diode layers on the transparent flexible substrate 22 in a micro transfer printing technique. At this point, in performing the transfer printing technique, it is preferable to transfer and attach 10,000 or more microLED pixels 26 per second on the transparent flexible substrate 22 using a roll transfer technique.

The microLED pixels 26 are prepared on a native substrate and then transferred and printed on the transparent flexible substrate 22, and the native substrate and unnecessary portions are removed thereafter.

In an embodiment of the present invention, the transparent flexible substrate 22 preferably has transparency and flexibility. The transparent flexible substrate 22 is selected in a thickness range among 5 to 10 μm, 10 to 50 μm, 50 to 100 μm, 100 to 200 μm, 200 to 500 μm, 0.5 to 1 mm, 1 to 5 mm, and 5 to 10 mm.

Figure 4:
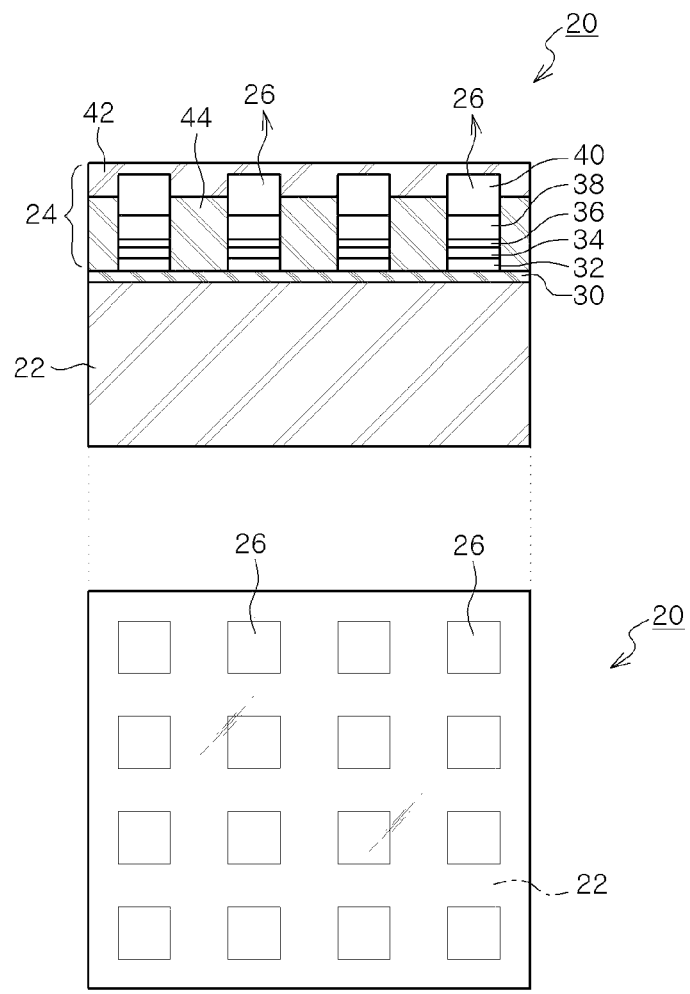
FIG. 4 is cross-sectional and plan views showing a microLED display skin according to an embodiment of the present invention.

FIG. 4 is cross-sectional and plan views showing the configuration of a microLED display skin 20 applied to an embodiment of the present invention, and it is a configuration in which the semiconductor device layer 24 having microLED pixels 26 is formed to be attached on the transparent flexible substrate 22 having both transparency and flexibility.

Referring to FIG. 4, the microLED pixel 26 of the semiconductor device layer 24 is configured of a positive electrode layer 30, a transparent conductive layer 32, a transparent p-electrode layer 34, a p-GaN layer 36, an active layer 38, an n-GaN layer 40, and an upper transparent n-electrode layer 42, and a transparent insulating layer 44 is formed between the microLED pixels 26. Each of the microLED pixels 26 formed in the semiconductor device layer 24 is a p-n diode layer, which is a compound semiconductor having a band gap corresponding to a specific region in the spectrum, and in the example of the present invention, it is formed of gallium nitride (GaN), which is a representative example of III to V nitride materials.

The transparent p-electrode layer 34 is a layer for supplying power, and forms an electrode using an oxide containing Al, Ga, Ag, Sn, In, Zn, Co, Ni, or Au having a transmittance of 70% or more. The positive electrode layer 30 becomes a circuit pattern, a bump, or a conductive adhesive layer, and the transparent n-electrode layer 42 has electrical conductivity. The positive electrode layer 30 may be selected from a group of silver and nickel having reflectivity to the visible spectrum, and forms a potential reflective mirror layer.

In addition, the present invention may implement the microLED display skin 20 in full color by arranging three self-light emitting elements having red (R), green (G) and blue (B) colors.

It is preferable for the microLED display skin 20 of the present invention to use the transparent flexible substrate 22 having both transparency and flexibility so that the wallpaper or the like, which is the base surface of the skin 20, may play a decorative role even when the microLED display is not in operation, and pixels made of microLED chips, i.e., the microLED pixels 26, are also configured to have maximum transparency.

Figure 5:
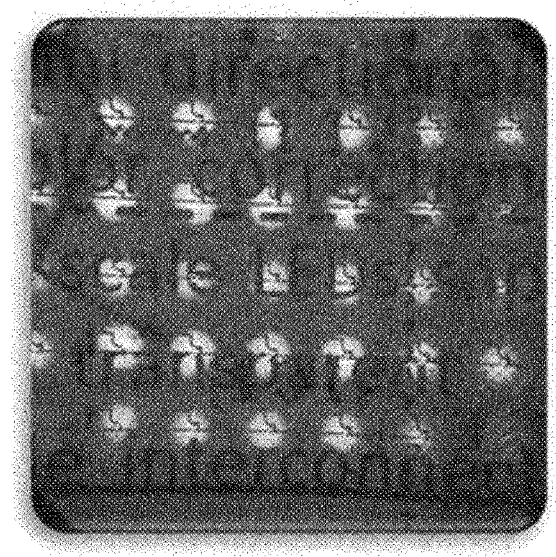
FIG. 5 is a picture showing an example of a microLED display skin applied to the present invention.

FIG. 5 is a picture showing an example of a transparent microLED display skin 20 applied to a digital decoration apparatus of the present invention, and shows that the letters on a sheet lying under the transparent microLED display skin 20 are shown.

As described above, in the present invention, since the microLED display skin 20 has transparency, when wallpaper is applied on the interior surface unit 10, the pattern of the wallpaper may be shown as it is.

Therefore, when the transparent microLED display skin of the digital decoration apparatus does not operate, a general wallpaper pattern may be expressed as it is, and when the transparent microLED display skin 20 operates, various design expressions or color expressions including three-dimensional expressions and a video playback function can be implemented.

Figure 6:
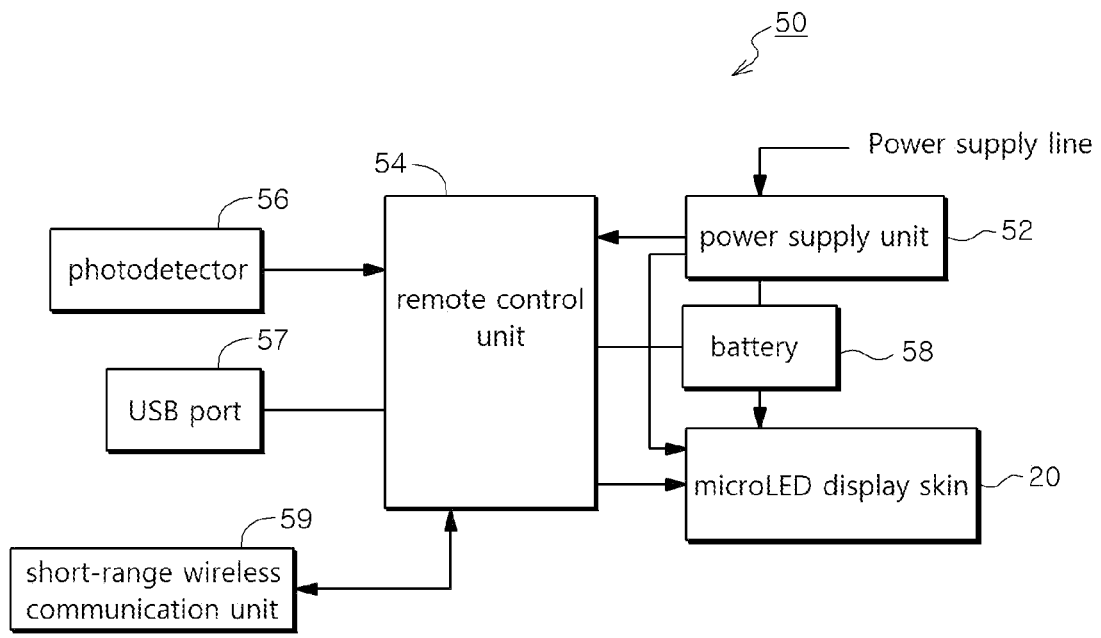
FIG. 6 is a circuit block diagram showing a remote slave for driving a microLED display skin according to the present invention.

FIG. 6 is a circuit block diagram showing a remote slave 50 for driving a microLED display skin 20 according to the present invention.

Referring to FIG. 6, the remote slave 50 electrically connected in the vicinity of the microLED display skin 20 includes a power supply unit 52 connected to a power supply line, a remote control unit 54 for performing control to display the decorative design or video wirelessly transmitted from the portable terminal 6 on the microLED display skin 20, a photodetector 56 for detecting brightness of light around a corresponding microLED display skin 20, a USB port 57 capable of USB (Universal Serial Bus) connection, a battery 58 provided in case of power failure in the remote slave 50 or the microLED display skin 20, and a short-range wireless communication unit 59 for transmitting and receiving data via short-range wireless communication with the portable terminal 6 such as a smartphone.

The remote slave 50 may use the short-range wireless communication unit 59 to directly connect to the portable terminal 6 represented by a smartphone using a short-range wireless communication method such as Bluetooth communication, Wi-Fi communication, NFC communication, IR communication, or Li-Fi communication.

In addition, the photodetector 56 of the remote slave 50 detects the amount of light around the microLED display skin 20 and applies it to a corresponding remote control unit 54, and the remote control unit 54 controls the display luminance brightness of the microLED display skin 20 based on the amount of light. That is, it is possible to automatically adjust the luminance brightness of the microLED display skin 20 corresponding to the brightness environment around the microLED display skin 20.

Figure 7:
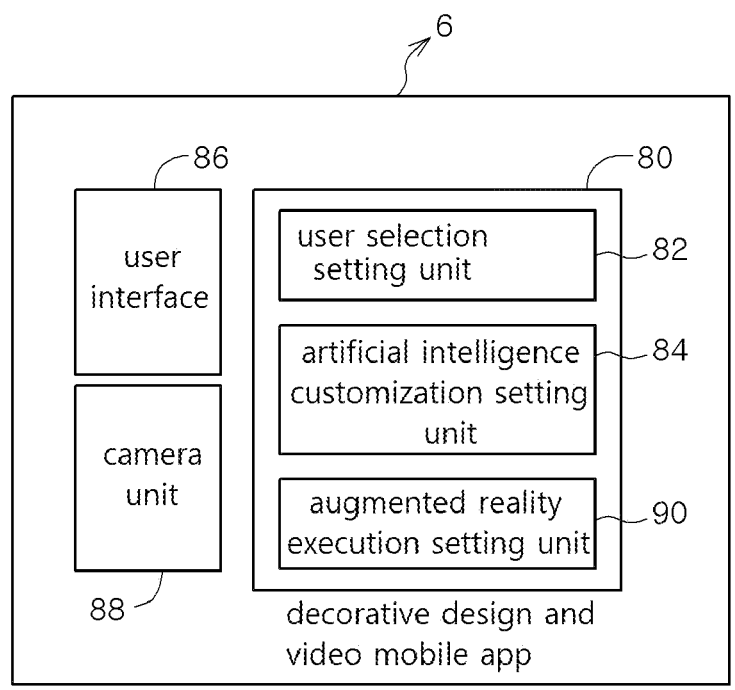
FIG. 7 is a block diagram showing the configuration of a portable terminal such as a smartphone on which a decorative design and video mobile app is mounted to display a decorative design or video on a microLED display skin in a digital decoration apparatus according to an embodiment of the present invention.

FIG. 7 is a block diagram schematically showing the configuration of a portable terminal 6 such as a smartphone applied to a digital decoration apparatus according to an embodiment of the present invention, and in order to display a decorative design or video on the microLED display skin 20 coated on the interior surface unit 10, a decorative design and video mobile app 80 is mounted, and a user interface 86 made of a touch screen and the like and a camera unit 88 are included.

According to the present invention, as the portable terminal 6 such as a smartphone downloads and mounts a decorative design and video mobile app 80 uploaded to application markets (iTunes App Store, Android Market, etc.), the mobile program of the decorative design and video mobile app 80 may be driven by selection of a user.

The decorative design and video mobile app 80 mounted on the portable terminal 6 controls through the user interface 86 to wirelessly transmit a decorative design or video selected to meet the user's needs from the portable terminal 6 to the remote slave (step 50 in FIG. 1) connected to a corresponding microLED display skin 20.

The decorative design and video mobile app 80 is configured to include a user selection setting unit 82, an artificial intelligence customization setting unit 84, and an augmented reality execution setting unit 90.

The user selection setting unit 82 is a functional unit that allows a user to select a decorative design or video corresponding to a corresponding microLED display skin 20 and set a display, or turns on or off light using the microLED display skin 20 when there is a request for turning on or off the lighting function.

The artificial intelligence customization setting unit 84 is a functional unit that allows an artificial intelligence unit to analyze a video captured through the camera unit 88 of the portable terminal 6 when there is a request for a customized decorative design based on an artificial intelligence function, select a decorative design, and set a display.

The augmented reality execution setting unit 90 is a functional unit that allows a virtual object video matching with a real object such as neighboring furniture to be expressed together on a corresponding microLED display skin 20 desired by the user using the camera unit 88 of the portable terminal 6 and an augmented reality program.

Therefore, the user may select a decorative design (including color) or video of the microLED display skin 20 using the user selection setting unit 82, the artificial intelligence customization setting unit 84, or the augmented reality execution selection (→setting) unit 90, and when execution of the decorative design and video mobile app 80 is requested through the user interface 86, a design and video control command according to execution of the decorative design and video mobile app 80 is wirelessly transmitted from the portable terminal 6 to the remote slave 50.

First, the portable terminal 6 of the present invention sets registration of all microLED display skins 20 installed on the interior surface unit 10 in the portable terminal 6 through registration communication using a short-range wireless communication method with the remote slave 50 of a corresponding microLED display skin 20.

Therefore, when the user executes the decorative design and video mobile app 80 of the portable terminal 6, connection information for all connected control target microLED display skins 20 is displayed in a short-range wireless communication method, and the user may confirm the connection information. Expression of information on the confirmation to the user side may be displayed as a three-dimensional view screen on the screen of the portable terminal 6.

Figure 8A:
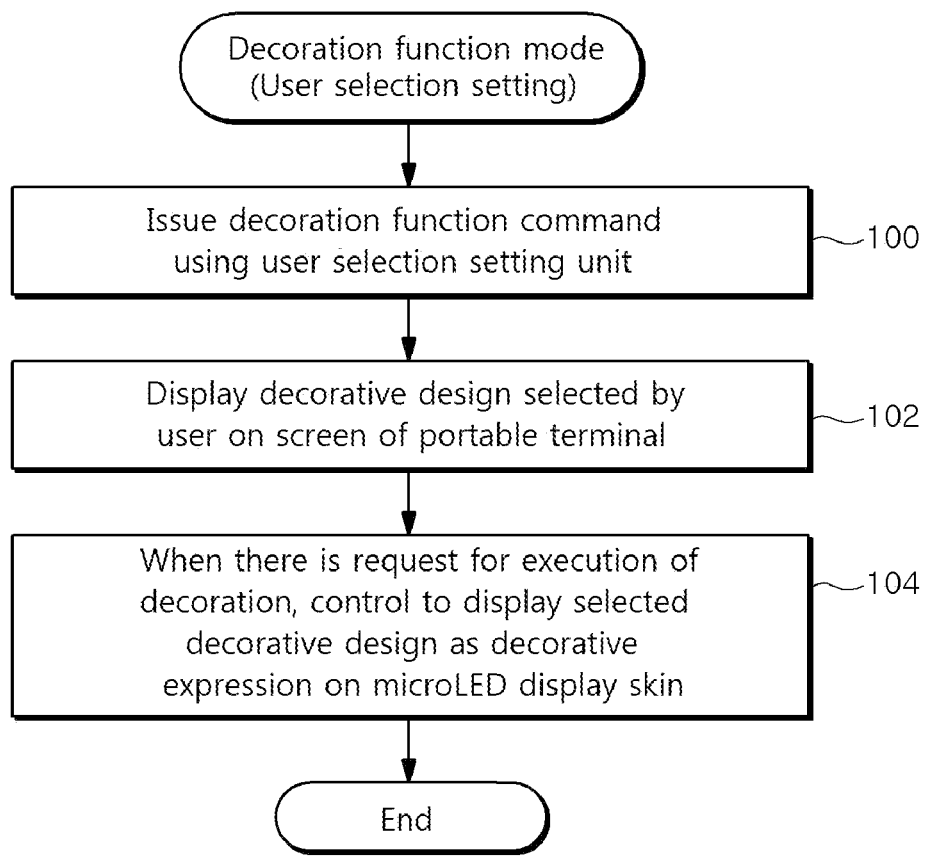
Figure 8B:
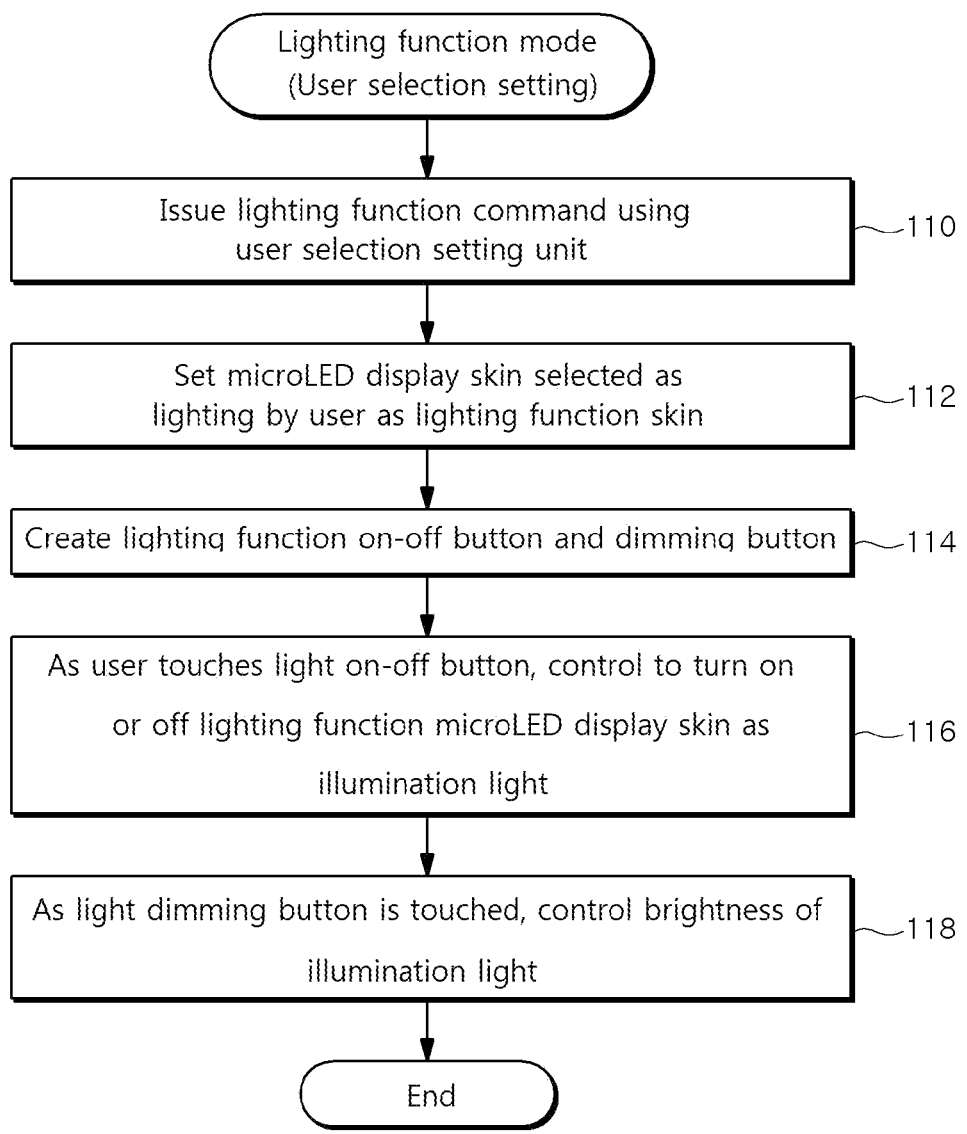

FIGS. 8a to 8c are control flowcharts expressing a decorative design function, a lighting function, and a video play function on a microLED display skin 20 using the user selection setting unit 82 of the decorative design and video mobile app 80 mounted on the portable terminal 6.

FIG. 8a is a control flowchart illustrating the process of performing a decorative design function on the microLED display skin 20 using the user selection setting unit 82, and FIG. 8b is a control flowchart illustrating the process of performing a lighting function on the microLED display skin 20 using the user selection setting unit 82, and FIG. 8c is a control flowchart illustrating the process of expressing a video playback function on the microLED display skin 20 using the user selection setting unit 82.

First, display of a decoration function on the microLED display skin 20 will be described with reference to FIG. 8a.

When a user issues a command for performing the decorative design function using the user selection setting unit 82 of the decorative design and video mobile app 80 mounted on the portable terminal 6 (step 100 in FIG. 8a), the portable terminal 6 allows the user to select a desired decorative design (including color) through the user interface 86, and controls to display the decorative design selected by the user on the screen of the portable terminal 6 (step 102 in FIG. 8*a*).

Thereafter, when there is a request for execution of decoration, the portable terminal 6 wirelessly transmits the request to the remote slave 50 so that the decorative design selected by the user may be displayed as a decorative expression on the microLED display skin 20 applied on the interior surface unit 10 under the control of the remote slave 50 (step 104 in FIG. 8*a*).

Next, display of a lighting function on the microLED display skin 20 will be described with reference to FIG. 8*b*.

When a user issues a command for performing the lighting function using the user selection setting unit 82 of the decorative design and video mobile app 80 mounted on the portable terminal 6 (step 110 in FIG. 8*b*), in the portable terminal 6, the user selects a microLED display skin 20 desired to function as a lighting function and sets the microLED display skin as a lighting function skin through the user interface 86 (step 112 in FIG. 8*b*).

When the microLED display skin is set as a lighting function skin, it is controlled to create a light on-off button for the lighting function and a dimming button capable of adjusting brightness, and display the buttons on the lighting function screen of the portable terminal 6 (step 114 in FIG. 8*b*).

Thereafter, as the user touches the light on-off button using the portable terminal 6, it is controlled to turn on or off the microLED display skin 20 set by the user as the lighting function skin in the form of illumination light (step 116 in FIG. 8*b*). Accordingly, the lighting function remote slave 50 receiving a light on-off command from the portable terminal 6 turns on or off the illumination light on the microLED display skin 20.

In addition, as the user touches the dimming button using the portable terminal 6, the brightness level of the illumination light of the microLED display skin 20 set by the user as the lighting function skin is controlled (step 118 in FIG. 8*b*). Accordingly, the lighting function remote slave 50 receiving a dimming command from the portable terminal 6 adjusts brightness of the illumination light of the microLED display skin 20 corresponding to the lighting function.

Next, display of a video playback function on the microLED display skin 20 will be described with reference to FIG. 8*c*.

When a user issues a command for performing the video playback function on the microLED display skin 20 using the user selection setting unit 82 of the decorative design and video mobile app 80 mounted on the portable terminal 6 (step 120 in FIG. 8*c*), the portable terminal 6 controls to select a corresponding microLED display skin 20 and a screen size desired by the user through the user interface 86 (step 122 in FIG. 8*c*).

Thereafter, when there is a request for execution of video playback, the portable terminal 6 wirelessly transmits the request to the remote slave 50 of the selected microLED display skin 20 so that the video in the portable terminal 6 that the user desires to play back is displayed on the selected microLED display skin 20 in a screen size desired by the user under the control of the remote slave 50 (step 124 in FIG. 8*c*).

Therefore, in the video playback function mode, a video is displayed on the microLED display skin 20 of the interior surface unit 10 desired by the user in a screen size desired by the user, and the user displays a video played back in the portable terminal 6 on the microLED display skin 20 of an interior surface unit 10 desired by the user.

It should be understood that even when a video is displayed on the microLED display skin 20 of the interior surface unit 10, the screen may be divided into multiple screens so that several videos may be provided simultaneously.

FIG. 9 is a control flowchart expressing a decorative design function on a microLED display skin 20 using the artificial intelligence customization setting unit 84 of the decorative design and video mobile app 80 mounted on the portable terminal of the present invention.

Display of a decoration function on the microLED display skin 20 will be described with reference to FIG. 9.

When a user issues a command for performing the decorative design function using the artificial intelligence customization setting unit 84 of the decorative design and video mobile app 80 mounted on the portable terminal 6 (step 200 in FIG. 9), the portable terminal 6 activates the camera unit 88 and recommends a decorative design matching the surrounding indoor objects photographed through the camera unit 88 using an artificial intelligence module to be displayed on the screen display unit of the portable terminal 6 (step 202 of FIG. 9).

Thereafter, when there is a request for execution of decoration, the portable terminal 6 wirelessly transmits the request to the remote slave 50 so that the selected decorative design (e.g., natural scenery such as a mountain or a lake is possible) may be displayed as a decorative expression on the microLED display skin 20 applied on the interior surface unit 10 under the control of the remote slave 50 (step 204 in FIG. 9).

Therefore, in the decoration function mode using the artificial intelligence customization setting unit 84, a design decoration recommended by the artificial intelligence module is expressed to match indoor objects on the microLED display skin 20 of the indoor surface part 10 desired by the user.

Figure 11:
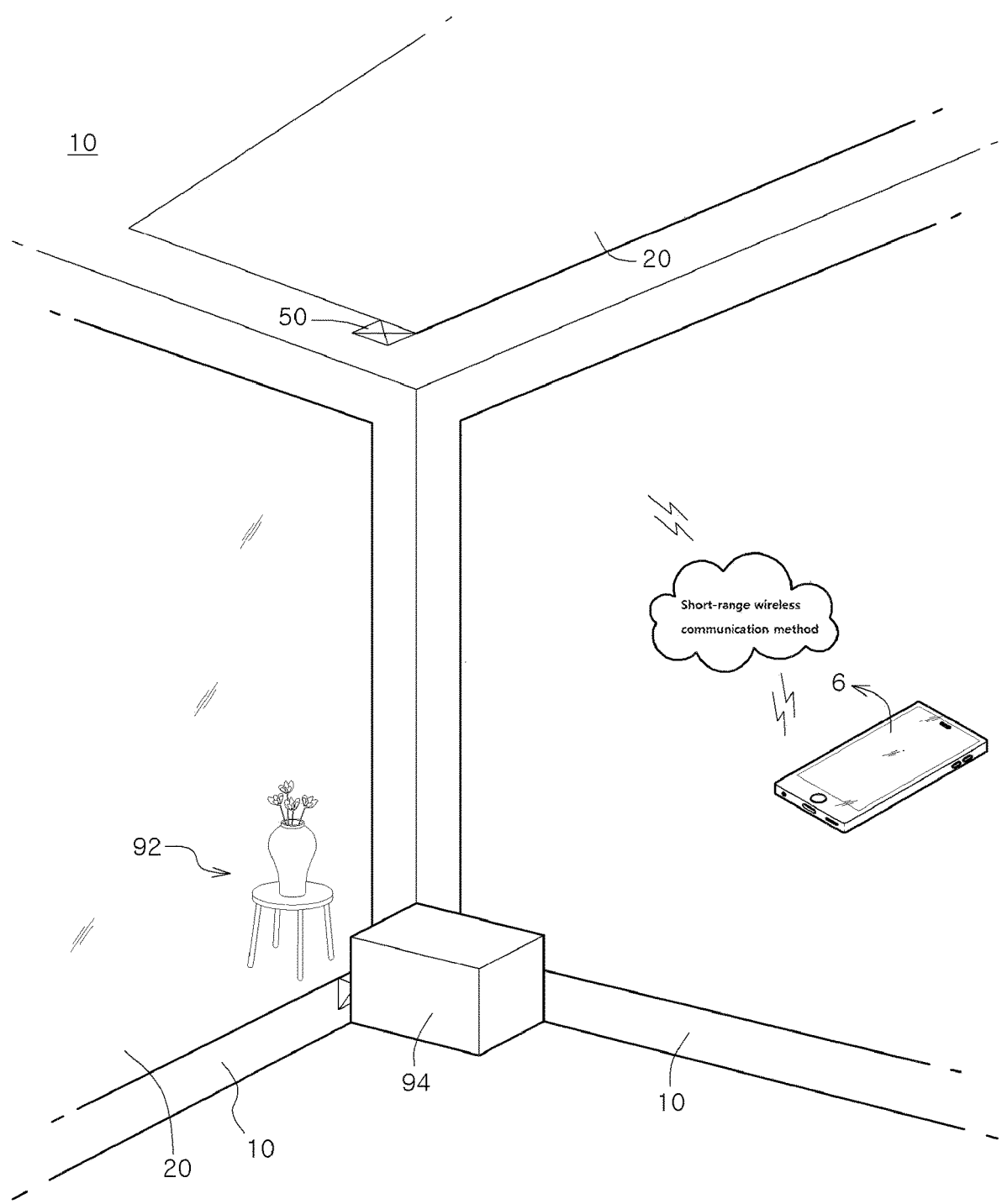
FIG. 11 is a configuration view expressing a virtual object decorative design on a microLED display skin using an augmented reality execution setting unit of a decorative design and video mobile app mounted on a portable terminal of the present invention.

FIG. 10 is a control flowchart expressing a decorative design function on a microLED display skin 20 using the augmented reality execution setting unit 90 of the decorative design and video mobile app 80 mounted on the portable terminal of the present invention, and FIG. 11 is a configuration view expressing a virtual object decorative design on a microLED display skin 20 using the augmented reality execution setting unit 90 of the decorative design and video mobile app 80 mounted on the portable terminal 6 of the present invention.

Display of a decoration function using the augmented reality execution setting unit 90 on the microLED display skin 20 will be described with reference to FIGS. 10 and 11.

When a user issues a command for performing the decorative design function using the augmented reality execution setting unit 90 of the decorative design and video mobile app 80 mounted on the portable terminal 6 (step 300 in FIG. 10), the portable terminal 6 activates the camera unit 88 and photographs indoor objects around the microLED display skin 20 using the camera unit 88 (step 302 of FIG. 10).

The portable terminal 6 recommends three-dimensional virtual decorative videos 92 photographed by the camera unit 88 and matching surrounding indoor objects (94 in FIG. 11) to an augmented reality module and selects a video using the user interface 86 (step 304 in FIG. 10).

Thereafter, when there is a request for execution of decoration, the portable terminal 6 wirelessly transmits the request to the remote slave 50 so that the three-dimensional virtual decorative video 92 matching surrounding indoor objects 94 in the real world may be displayed as a decorative expression on the microLED display skin 20 applied on the interior surface unit 10 under the control of the remote slave 50 (step 306 in FIG. 10).

As described above, in the present invention, since an object of the real world and a three-dimensional virtual object are shown to be overlapped on the microLED display skin 20 using an augmented reality (AR) technique, five human senses are stimulated to provide a video that expands senses and perceptions. In addition, mixed reality (MR) is realized by providing an environment in which real and virtual worlds are mixed.

Therefore, in the decoration function mode using the augmented reality execution setting unit 90, a design decoration recommended by the augmented reality module is expressed to match indoor objects on the microLED display skin 20 of the interior surface unit 10 desired by the user.

The visual digital decoration apparatus of the present invention as described above may control expressions of design or video, including three-dimensional expressions, and changes thereof on the microLED display skin 20 of the digital decoration device through short-range remote control using a portable terminal 6 such as a smartphone.

Although specific embodiments have been described in the above description of the present invention, various modifications may be made without departing from the scope of the present invention. Therefore, the scope of the present invention should not be defined by the described embodiments, but should be defined by the claims and equivalents to the claims.

INDUSTRIAL APPLICABILITY

The present invention may be used to decorate interior surface units, i.e., surfaces of walls or ceilings, or surfaces of furniture or large home appliances arranged in a room, using a microLED display.

The invention claimed is:

1. A visual digital decoration apparatus comprising:
one or more microLED display skins coated on an interior surface unit of one or more among surfaces of walls or a ceiling of a room and surfaces of furniture and large home appliances arranged in a room to be disposed in a form of a decorative screen;
one or more remote slaves provided to drive a corresponding microLED display skin; and
a portable terminal for wirelessly controlling the remote slave so that a decorative design or video requested through a user interface is expressed on a microLED display skin selected by a user,
wherein the microLED display skin has a configuration in which a semiconductor device layer capable of displaying and expressing a color and a design toward the outside and having microLED pixels on a flexible substrate is transferred and attached, and
wherein the remote slave includes;
a power supply unit connected to a power supply line,
a remote control unit for performing control to display the decorative design or video wirelessly transmitted from the portable terminal on the microLED display skin,
a Universal Serial Bus (USB) port capable of USB connection, and
a short-range wireless communication unit for performing remote transmission and reception via short-range wireless communication with the portable terminal, and
wherein the portable terminal includes a decorative design and video mobile app mounted on the portable terminal to control to select a decorative design or video requested through the user interface and to wirelessly transmit the decorative design or video from the portable terminal to the remote slave connected to the microLED display skin selected by the user,
wherein the decorative design and video mobile app includes an augmented reality execution setting unit that allows a virtual object video matching with a neighboring real object to be expressed on the microLED display skin desired by the user and an augmented reality module that recommends virtual object videos matching with a neighboring real object photographed by a camera unit, selects one of the virtual object videos through the user interface, and controls the microLED display skin desired by the user to display the selected virtual object video as a decorative expression.

2. The apparatus according to claim 1, wherein the microLED display skin includes a transparent microLED display skin having transparency and flexibility, and
wherein the remote slave further includes:
a photodetector for detecting brightness of light around the microLED display skin, and
a battery provided in case of power failure in the remote slave or the microLED display skin.

3. The apparatus according to claim 1, wherein the decorative design and video mobile app further includes at least one of:
a user selection setting unit that allows a user to select a decorative design or video corresponding to the microLED display skin selected by the user and set a display to display the selected decorative design or video, or turns on or off light using the microLED display skin when there is a request for turning on or off a lighting function; and
an artificial intelligence customization setting unit that allows an artificial intelligence unit to analyze a video captured through the camera unit of the portable terminal when there is a request for a customized decorative design based on an artificial intelligence function, select a decorative design, and set a display to display the selected decorative design or video.

4. A control method of a visual digital decoration apparatus including a remote slave for driving one or more microLED display skins disposed to be coated on one or more interior surface units in an indoor space, and a portable terminal for wirelessly controlling the remote slave so that a decorative design or video requested through a user interface is expressed on the microLED display skin selected by a user, the method comprising:
mounting a decorative design and video mobile app that controls to display the decorative design or video on the microLED display skin on the portable terminal;
selecting a decorative design desired by the user and a microLED display skin at a location desired by the user through a user selection setting unit in the decorative design and video mobile app and the user interface in the portable terminal, and displaying the decorative design selected by the user interface as a decorative expression on the selected microLED display skin, by the remote slave, as a decoration execution request is wirelessly transmitted;
selecting a lighting function desired by the user and a microLED display skin at a location desired by the user through the user selection setting unit in the decorative design and video mobile app in the portable terminal and the user interface in the portable terminal, and turning on and off illumination light selected by the user interface on the selected microLED display skin, by the remote slave, as a lighting function execution request is wirelessly transmitted;

selecting a video playback function desired by the user and a microLED display skin at a location desired by the user through the user selection setting unit in the decorative design and video mobile app in the portable terminal and the user interface in the portable terminal, and displaying a video selected by the user interface to be played back in a screen size desired by the user on the selected microLED display skin, by the remote slave, as a video playback function execution request is wirelessly transmitted; and recommending, by an augmented reality module, virtual decorative videos matching with indoor objects photographed by a camera unit, selecting one of the virtual decorative videos through the user interface, and displaying the selected virtual decorative video on the microLED display skin as a decorative expression, by the remote slave, as a decoration execution request is wirelessly transmitted.

5. The method according to claim 4, further comprising:

recommending, by an artificial intelligence module, decorative designs matching with indoor objects through an artificial intelligence customization setting unit in the decorative design and video mobile app and the camera unit, selecting a decorative design through the user interface, and displaying the selected decorative design as a decorative expression on the microLED display skin, by the remote slave, as a decoration execution request is wirelessly transmitted.

* * * * *